(12) United States Patent
Hood, III et al.

(10) Patent No.: US 6,172,869 B1
(45) Date of Patent: Jan. 9, 2001

(54) PORTABLE COMPUTER WITH BEZEL SNAP SCREW COVER AND MOLDED SPRING LATCH

(75) Inventors: Charles D. Hood, III, Cedar Park; Carmen Schlesener, Pflugerville, both of TX (US)

(73) Assignee: Dell USA, L.P., Round Rock, TX (US)

( * ) Notice: Under 35 U.S.C. 154(b), the term of this patent shall be extended for 0 days.

(21) Appl. No.: 09/217,218

(22) Filed: Dec. 21, 1998

(51) Int. Cl.[7] ............................................. H05K 5/02
(52) U.S. Cl. ............... 361/681; 361/683; 312/265.5; 312/265.6; 312/223.1; 312/223.2; 312/223.3
(58) Field of Search .................... 361/681, 683; 312/265.5, 265.6, 223.1, 223.2, 223.3

(56) References Cited

U.S. PATENT DOCUMENTS

| | | |
|---|---|---|
| 4,960,335 | 10/1990 | Otto et al. . |
| 5,198,966 | 3/1993 | Kobayashi et al. . |
| 5,255,154 * | 10/1993 | Hosoi et al. ........................... 361/680 |
| 5,682,017 | 10/1997 | Marrotte . |
| 5,726,867 | 3/1998 | Zarreii . |
| 5,905,550 * | 5/1999 | Ohgami et al. ........................ 349/58 |
| 5,934,772 * | 8/1999 | Sung .................................... 312/7.2 |

FOREIGN PATENT DOCUMENTS 297 12 775 U1   10/1997   (DE) .

* cited by examiner

Primary Examiner—Leo P. Picard
Assistant Examiner—Yean-Hsi Chang
(74) Attorney, Agent, or Firm—Haynes and Boone, L.L.P.

(57) ABSTRACT

A portable computer includes a base and a top pivotally mounted on the base for movement between an open position and a closed position. An LCD panel is mounted in the top and the top includes opposed sides having fastener access openings for securing the LCD panel. A bezel includes snap tabs for attaching the bezel to the top, and for covering the fastener access openings. A releasable latch is mounted in the top adjacent the LCD panel for securing the top to the base in the closed position, and for releasing the top from the base for movement to the open position. A spring member is molded into the latch for resiliently mounting a latch in the top.

15 Claims, 10 Drawing Sheets

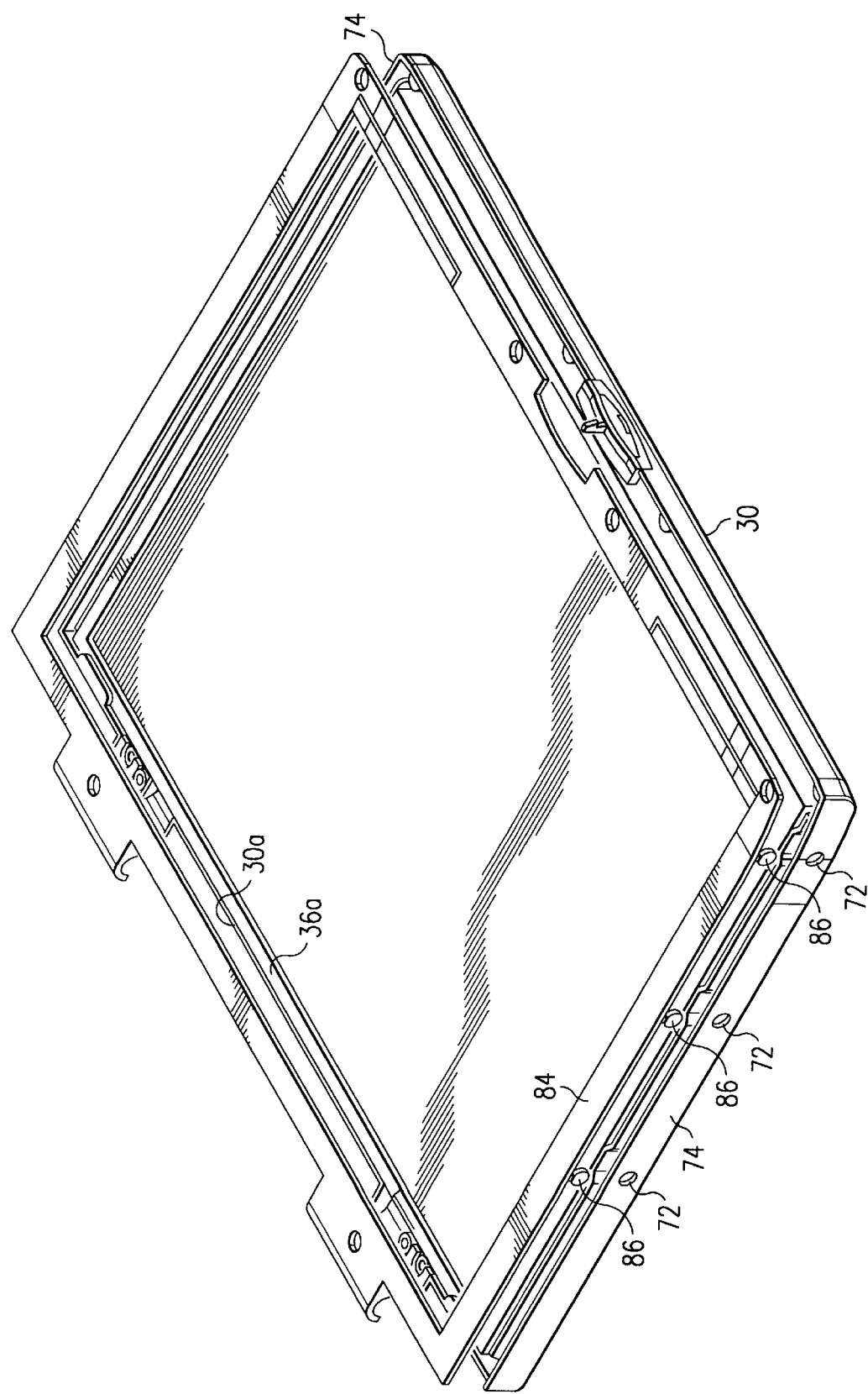

PORTABLE COMPUTER WITH BEZEL SNAP SCREW COVER AND MOLDED SPRING LATCH

BACKGROUNDS

The disclosures herein relate generally to portable computer and more particularly to a bezel cover and a spring latch mounted adjacent a liquid crystal display (LCD) panel in a top portion of the portable computer.

Portable laptop or notebook computers include a base and a top which is pivotally connected to the base at a hinged connection. When the top is raised, a liquid crystal display (LCD) panel mounted therein is exposed. The LCD panels are costly components available from several manufacturing sources and are available in various sizes. In addition, the spacing and orientation of the mounting points for one manufacturer may vary from the spacing and orientation of the mounting points for another manufacturer. As a result, several different top configurations are required for mounting the various size LCD panels and their multiple mounting points.

LCD panels are mounted between the top housing and a bezel. Various size LCD panels have different "active" areas, i.e. the area of the panel that becomes illuminated and is visible. As a result, the bezel used must cover the peripheral edges of the LCD panel in a manner which exposes only the active area for a particular panel. LCD panels are more recently being side mounted to a bracket mounted in the top housing. This has been done so that larger LCD panels can be mounted in the same size top housing as the smaller panels.

In order to secure the side mounted panels to the bracket, openings have been provided in the side walls of the top to allow access to the screw-type fasteners used to secure the panel to the bracket. The openings however are aesthetically unacceptable and have been covered either with a long adhesive strip which covers all of the openings, or with individual adhesive covers for each opening. Assembly of these covers creates opportunities for manufacturing defects and requires additional labor. In addition, extra parts are required to be purchased and assembled to cover these fastener openings.

Portable computer tops latch to the base when the top is closed or nested on the base. When unlatched, the top is rotated open thus exposing a keyboard on the base and the LCD panel mounted in the top. The latch which secures the base and top is typically mounted in the top adjacent an edge of the LCD panel. As a result, the amount of space available for the latch is limited. In addition, the increase in panel size has created additional space limitations for mounting the latch in the top. Furthermore, latch durability is always a concern.

A recent latch construction includes a molded plastic latch resiliently mounted by using a leaf spring attached to the latch. The latch also uses a hook which is plastic and subject to damage. One solution has been to provide a metal hook. However, a draw back is that the metal hook must be painted or anodized to provide an acceptable cosmetic finish to match the surrounding plastic of the latch. Also, rough edges of the plastic hook must be removed to limit the metal hook from causing damage to the mating plastic receiver.

Therefore, what is needed is a top which has a side mounted LCD panel and includes an aesthetically advantageous solution to covering fastener openings in the side walls of the top without requiring added parts and labor. Also a slim-line spring latch is needed which does not demand space needed to accommodate larger LCD panels and which is reinforced with metal without requiring additional painting or anodizing operations. In addition, the reinforced latch must be compatible with mating plastic parts.

SUMMARY

One embodiment, accordingly, provides an apparatus and a method for mounting a larger LCD panel in a portable computer top with side mounted fasteners such that fastener access openings are aesthetically covered without requiring added parts or labor. To this end, an attachment system includes a housing having opposed sidewalls having fastener openings formed therein for mounting a component in the housing. A cover member includes tabs for attaching the cover member to the housing and for simultaneously closing the fastener openings.

A principle advantage of this embodiment is that the snap tabs which secure the cover member to the housing include aesthetically pleasing covers attached thereto for seating into the fastener openings so that the openings are automatically closed, thus avoiding the need for additional parts or assembly.

BRIEF DESCRIPTION OF THE DRAWINGS FIGURES

FIG. 9 is an isometric view illustrating an embodiment of the portable computer top including the LCD panel and a detached bezel.

DETAILED DESCRIPTION

Figure 1:
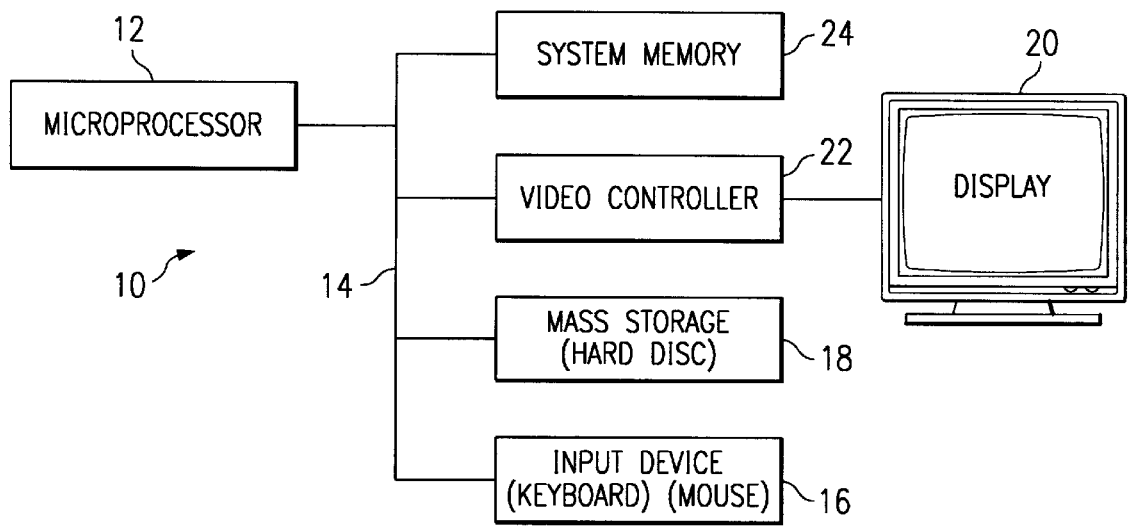
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
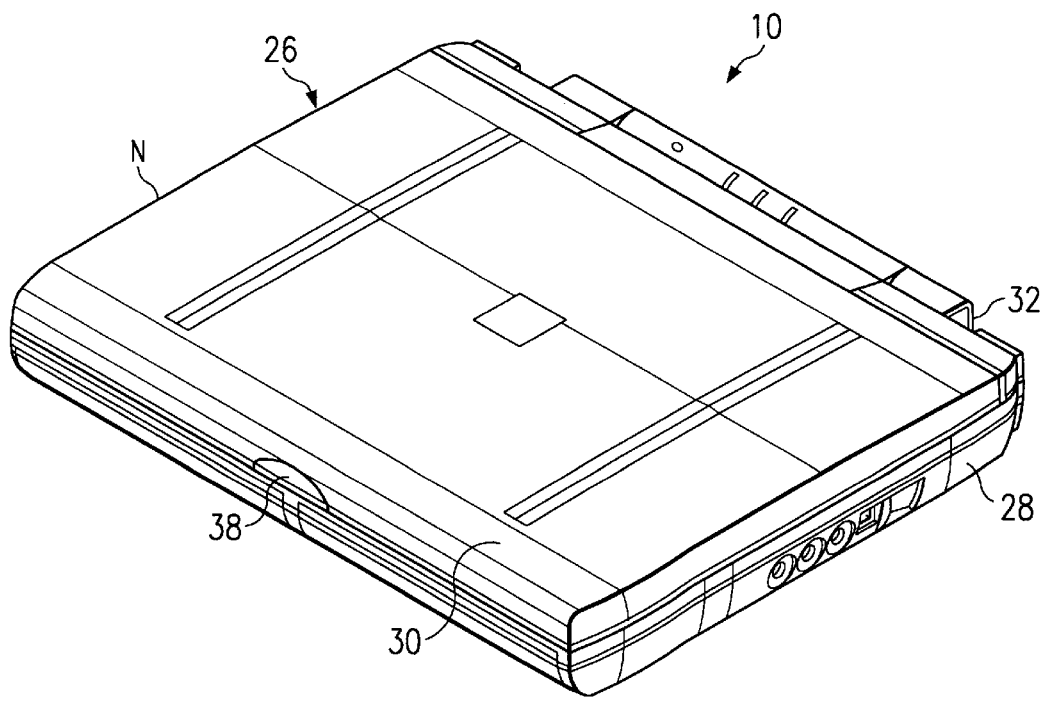
FIG. 2 is an isometric view illustrating an embodiment of a portable computer including a top in a closed position.

Computer system 10 is self-contained in a typical portable computer, i.e. a laptop or notebook type such as that generally designated 26 in FIG. 2. Laptop computer 26 comprises a base 28 and a top or housing 30 which are pivotally interconnected at a hinge 32. Top 30 is movable between a nested position N, wherein top 30 is engaged with base 28, and an open position O, FIG. 3, wherein top 30 is pivoted out of engagement with base 28. In the open position, O, an LCD panel 36 housed and mounted in top 30 is exposed and a keyboard 34 mounted in base 28 is also exposed.

Figure 3:
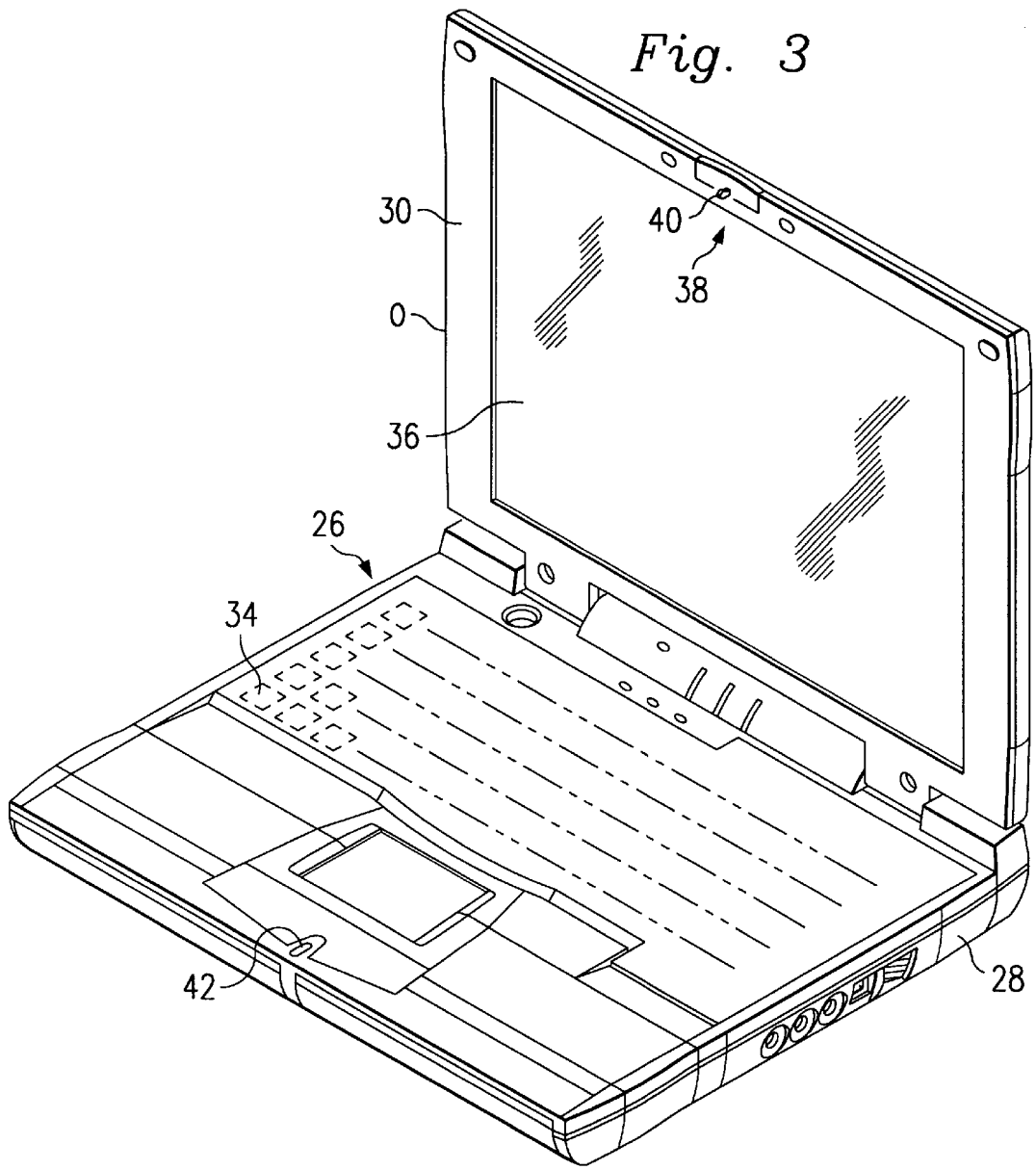
FIG. 3 is an isometric view illustrating an embodiment of the portable computer including the top in an open position.
Figure 4:
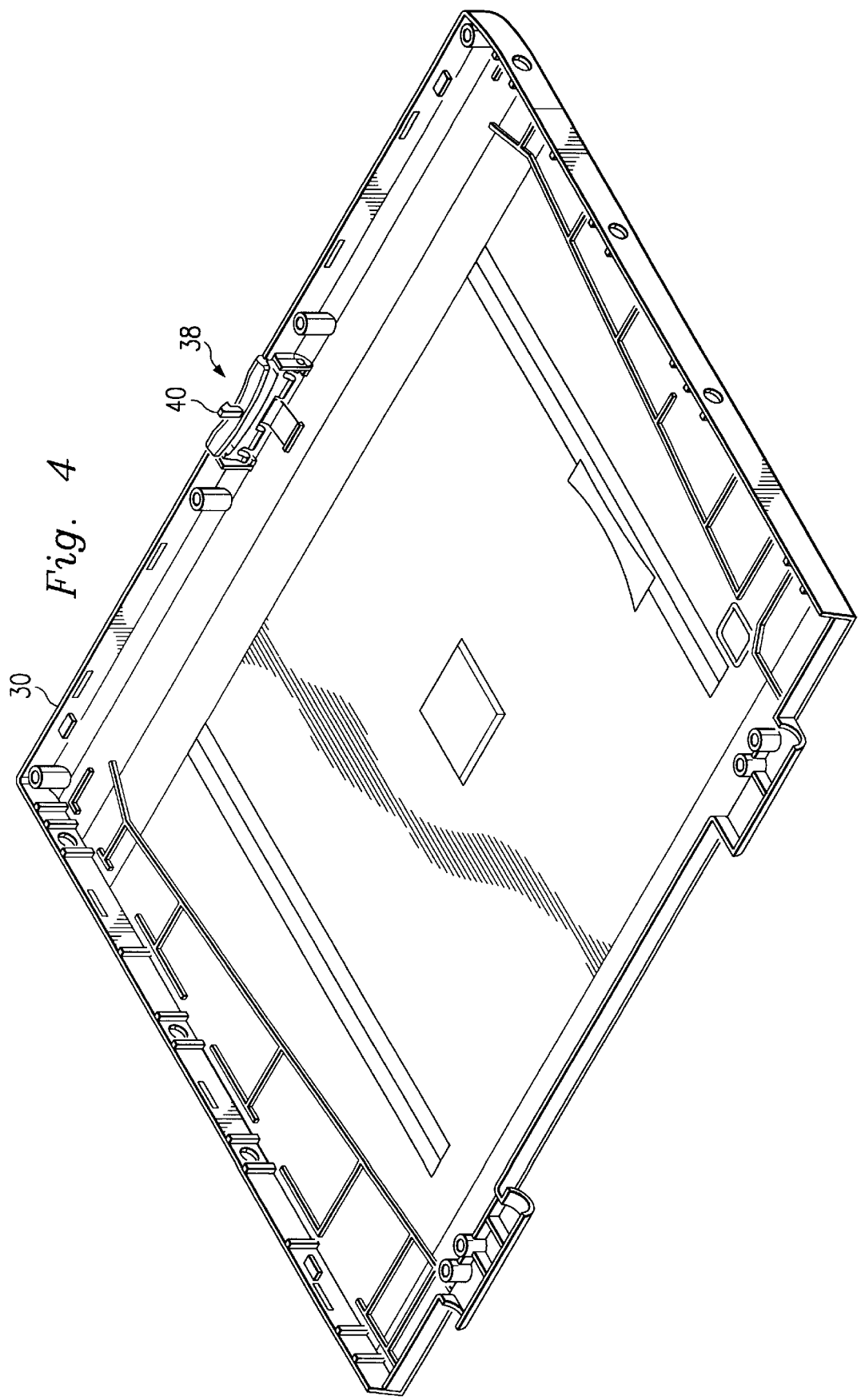
FIG. 4 is an isometric view illustrating an embodiment of the portable computer top having an LCD panel removed and revealing a latch mounted in the top.
Figure 5:
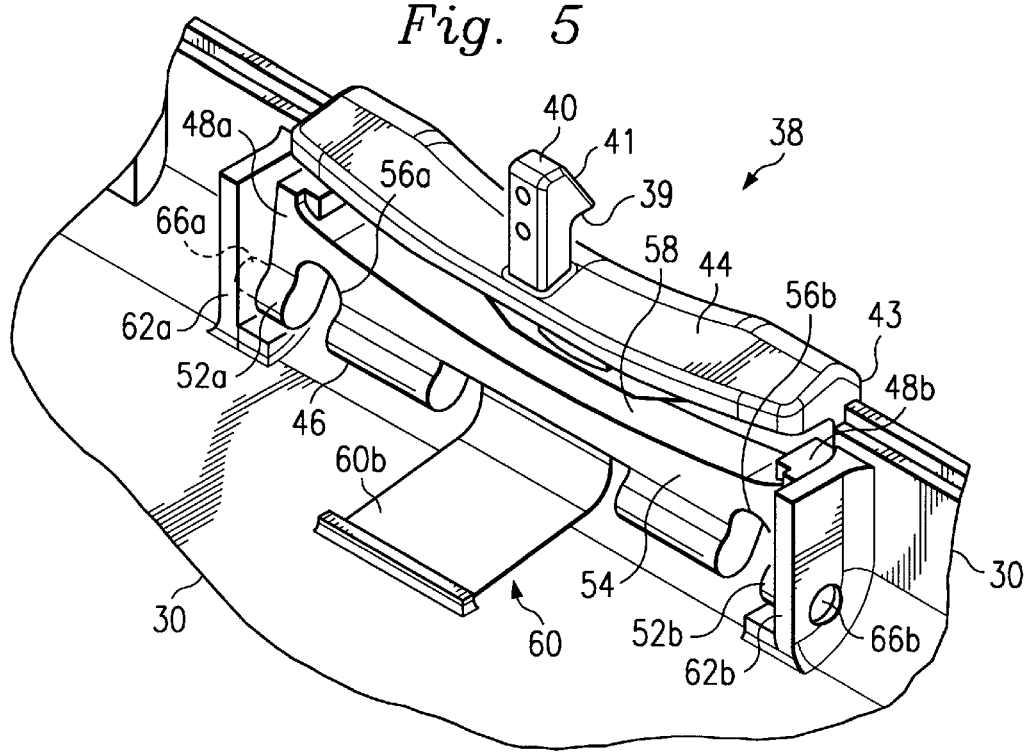
FIG. 5 is a partial isometric view illustrating the latch mounted in the top and a portion of a spring member engaging the top.

In order to maintain top 30 engaged with base 28, in the nested position N, FIG. 2, a latch 38, preferably formed of a suitable plastic, is mounted in top 30, FIG. 4. As illustrated in FIG. 3, latch 38 is dimensionally limited due to the fact that the latch 38 is mounted in top 30 adjacent LCD panel 36. Latch 38 is spring biased (as is discussed below) and includes a hook member 40, which extends to engage a receiver 42 formed in base 28. Hook member 40, FIG. 5, includes a cammed or sloped surface 41, permitting hook member 40 to slide into receiver 42, and includes a ledge 39 to limit unintentional withdrawal of hook 40 from receiver 42 see also FIG. 3.

Latch 38 is mounted in top 30, and includes a pressure surface 43, a top portion 44, a bottom portion 46, and opposite sides 48a and 48b. The hook member 40 extends or protrudes from top portion 44. A pair of flexible snap-in members, 52a, 52b, are positioned on the sides 48a, 48b. A first one of the snap-in members 52a is positioned on a first one of the sides 48a, and a second one of the snap-in members 52b is positioned on a second one of the sides 48b.

The flexible snap-in members 52a, 52b are provided by forming a pair of grooves 56a, 56b in a portion of a front face 54 adjacent sides 48a, 48b, thus permitting flexibility of the snap-in members 52a, 52b which extend substantially parallel to each other. A reinforcing rib 58 also extends transversely between sides 48a, 48b and protrudes from front face 54.

Latch 38, FIG. 4, snaps into top 30 by means of flexible snap-in members 52a, 52b engaging latch mounts 62a and 62b, formed in top 30 which is preferably formed of a suitable plastic material. Latch mounts 62a, 62b, FIG. 4, each include an aperture 66a, 66b, respectively formed therein, for receiving a respective one of the snap-in members 52a, 52b.

Figure 6:
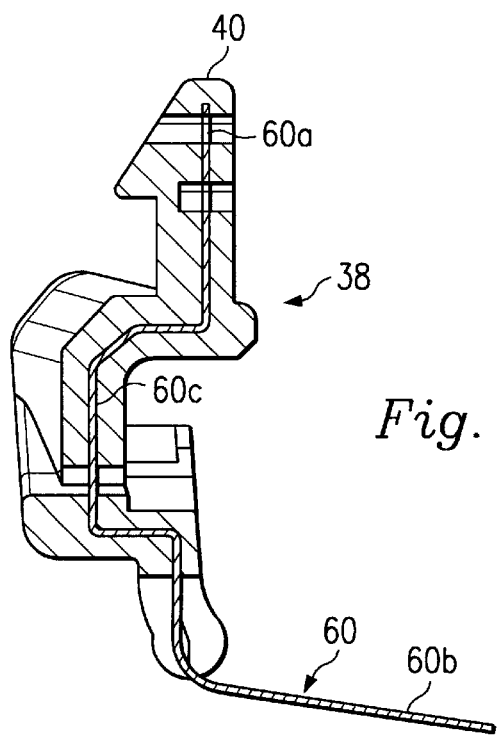
FIG. 6 is a cross-sectional side view illustrating an embodiment of the latch having the metal spring member molded into the plastic latch.

A spring member 60, preferably formed of a suitable spring steel, FIG. 6, is generally L-shaped and includes a first portion 60a, a second portion 60b and an intermediate portion 60c therebetween.

Again in FIG. 6, it can be seen that first portion 60a and intermediate portion 60c of spring 60 are molded into latch 38. In this position, first portion 60a of spring 60 reinforces hook member 40, and, when latch 38 is mounted in top 30, second portion 60b of spring 60 engages top 30 see also FIG. 5.

In operation, spring 60 is molded into latch 38 so that second portion 60b of spring 60 functions as a free end protruding from latch 38. Latch 38 is mounted in top 30 by inwardly flexing the flexible snap-in members 52a, 52b between latch mounts 62a, 62b respectively. Release of the snap-in flexible members 52a, 52b, respectively, permits the flexible members 52a, 52b to be engaged in the respective apertures 66a, 66b. This positions second or free end 60b of spring 60 in engagement with a portion of top 30.

When top 30 is closed into the N FIGS. 2–5, position nested with base 28, hook 40 is deflected against the force of spring 60 and snaps into engagement with receiver 42 of base 28. Such flexure is caused by sloped surface 41 of hook 40 engaging receiver 42 of base 28. When sloped surface 41 clears the receiver 42, the hook 40 snaps back so that ledge 39 engages base 28 and thus secures top 30 in engagement with base 28. When it is desired to open top 30 from nested position N to open position O, manual pressure applied to surface 43 of latch 38, urges hook 40 sufficiently to clear receiver 42, and top 30 can be rotated from nested position N to open position O.

If necessary, removal of latch 38 is accomplished by flexing inwardly, the snap-in flexible members 52a, 52b for withdrawal from respective apertures 66a, 66b, thus permitting latch 38 to be withdrawn from lid 30.

Figure 7:
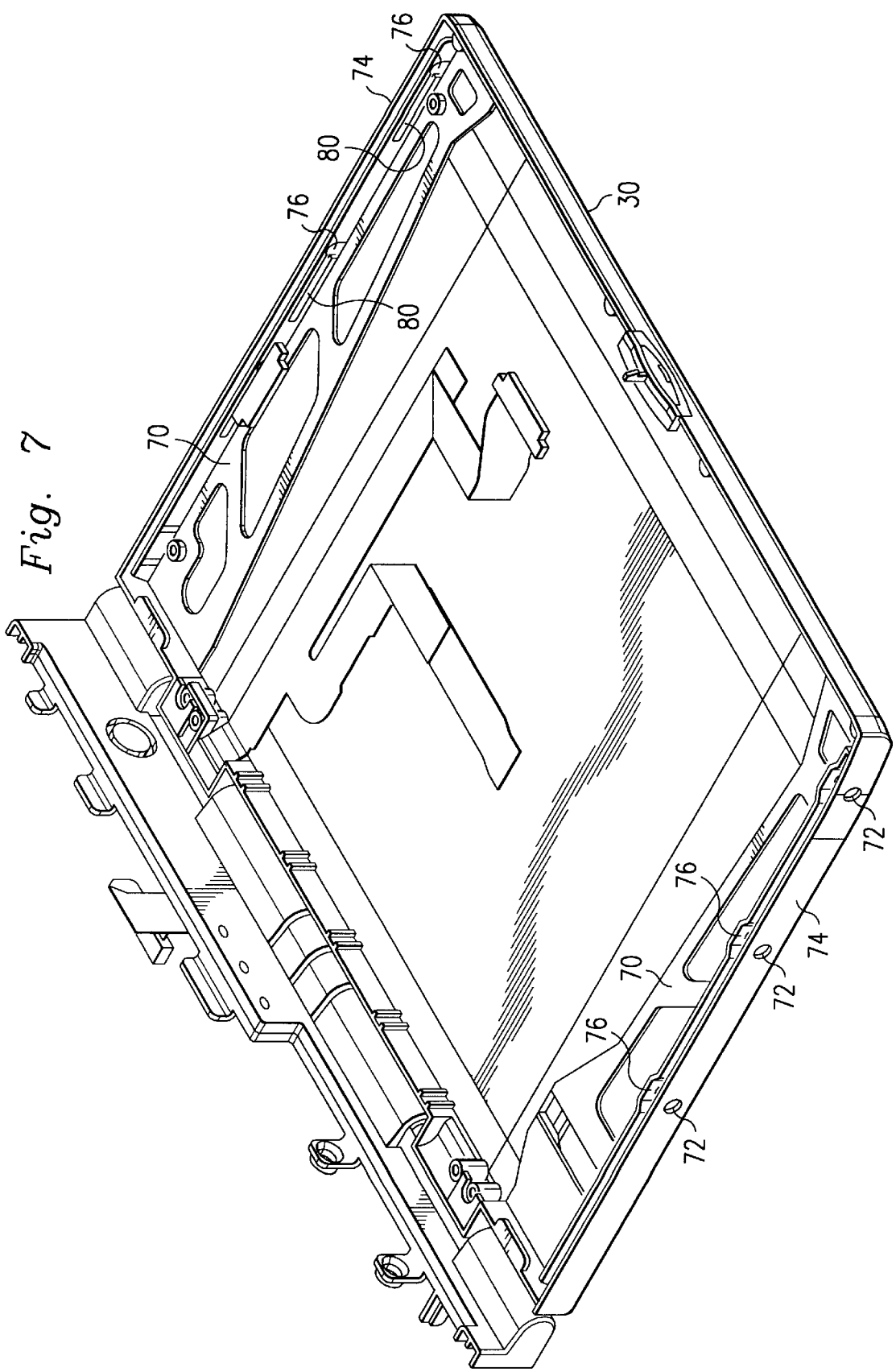
FIG. 7 is an isometric view illustrating an embodiment of the portable computer top including LCD panel mounting brackets.

A pair of brackets 70, FIG. 7, are secured in opposite sides 74 of top 30. Brackets 70 are preferably stamped metal parts and assist in securing LCD panel 36 in the plastic top 30. A plurality of fastener access openings 72, FIG. 7, are formed in opposed sidewalls 74 of top 30. Additional fastener openings 76, aligned with openings 72, are formed in each bracket 70. Access openings 72 provide tool access so that fastener openings 76 can receive threaded fasteners 78, FIG. 8 which attach into and retain LCD panel 36 in top 30. A feature of the brackets 70 includes the cantilever mounted flexible arms 80, FIG. 7, formed with at least one of the brackets 70. The arms 80 are flexed into contact with LCD panel 36 by fasteners 8. This is advantageous because it allows for dimensional variations between different sized, e.g. 13.3. and 14.1, LCD panels 36 which may be retained in top 30 by brackets 70.

Figure 8:
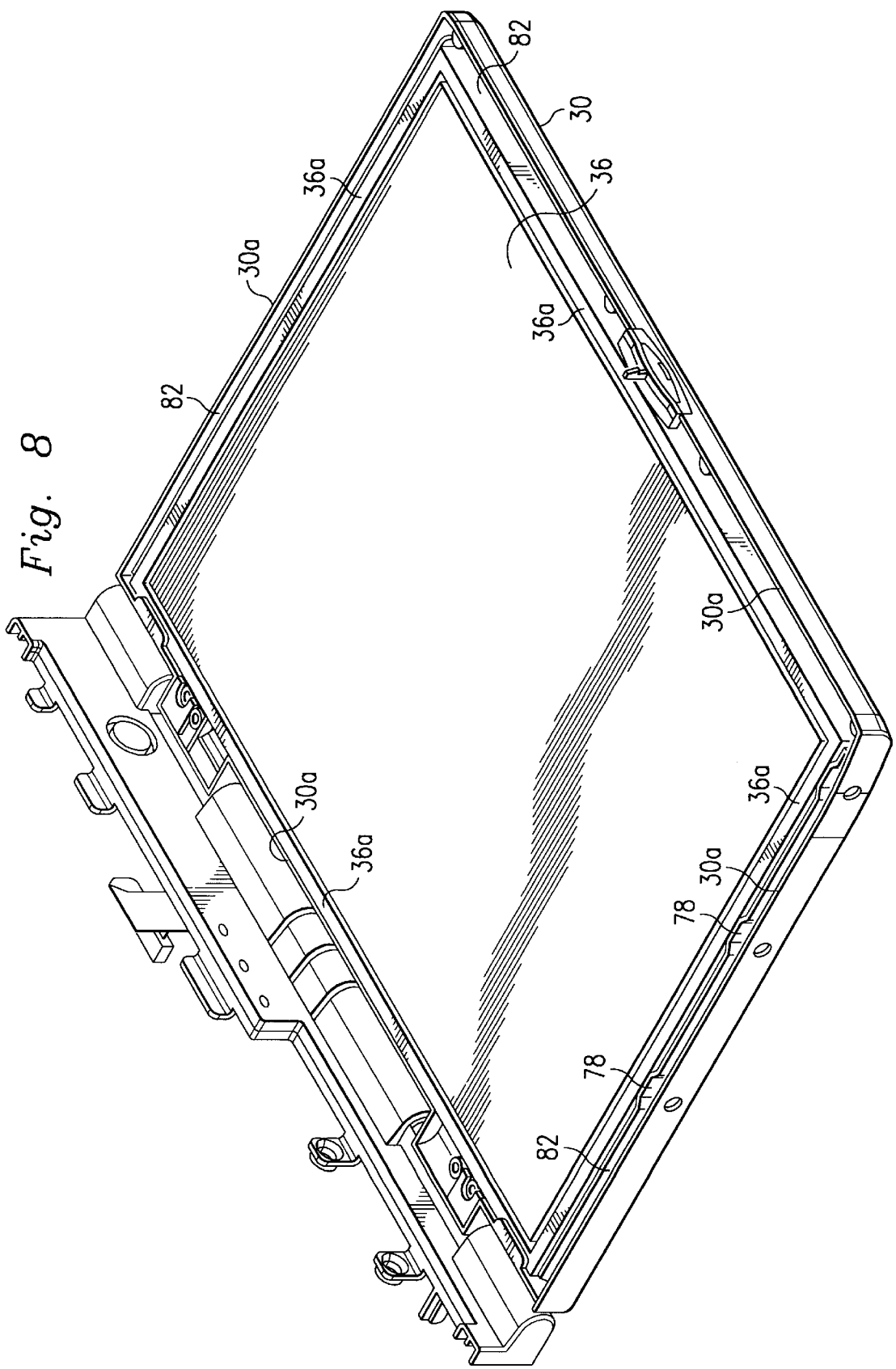
FIG. 8 is an isometric view illustrating an embodiment of the portable computer top including the LCD panel.

After LCD panel 36 is installed in top 30, FIG. 8, a gap 82 remains between a peripheral surface 36a of LCD panel and a peripheral surface 30a of top 30. The gap 82 is commonly concealed by a bezel or cover. Advantageously, a bezel 84 according to an embodiment illustrated in FIGS. 9, 9a and 9b, includes tabs 86 for attaching bezel 84 to top 30. Attachment is accomplished by flexible arms 88 which extend from bezel 84. The tabs 86 are connected to arms 88 and function to extend and snap into fastener access openings 72 in sidewalls 74 for retaining bezel 84 and for simultaneously covering the fastener access openings 72 in a closing engagement therewith.

Figure 9A:
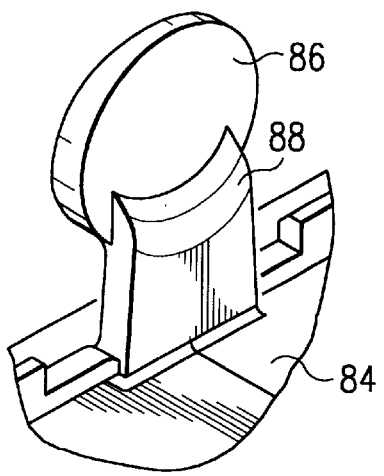
FIG. 9a is a partial isometric view illustrating an embodiment of a tab connected to a flexible arm.
Figure 9B:
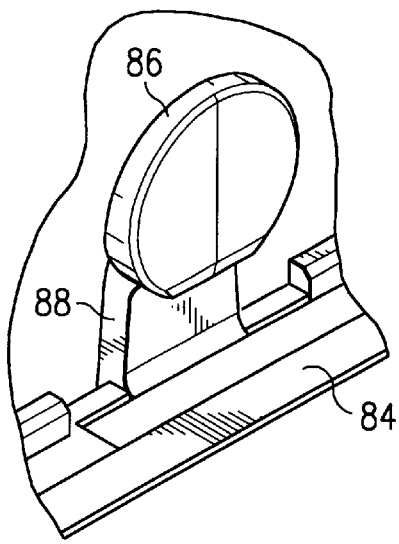
FIG. 9b is another partial isometric view illustrating an embodiment of the tab connected to the flexible arm.
Figure 10:
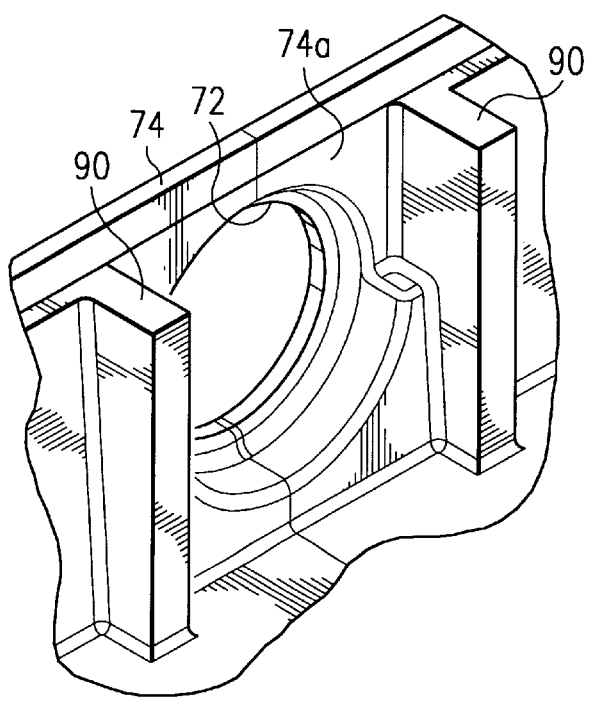
FIG. 10 is a partial isometric view illustrating an embodiment of guide grooves in the portable computer top.
Figure 11:
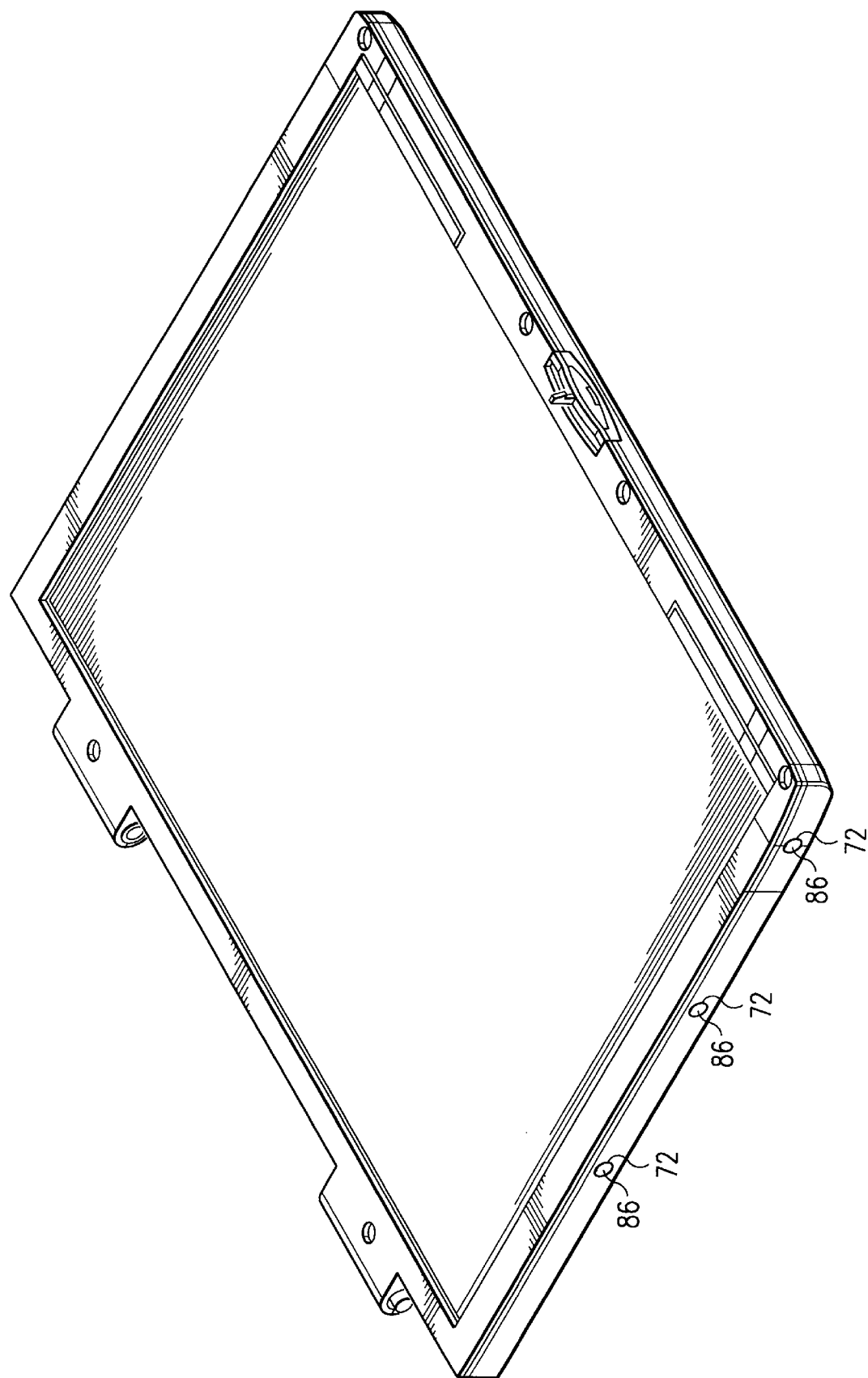
FIG. 11 is an isometric view illustrating an embodiment of the portable computer top including the LCD panel and the bezel.
Figure 11C:
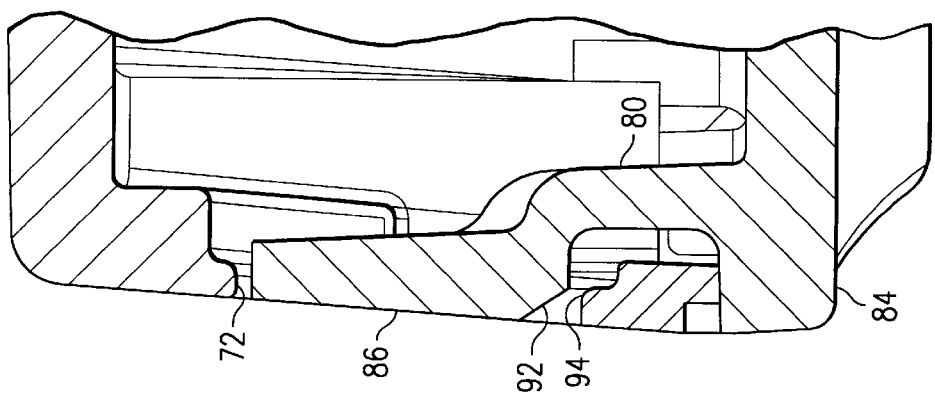
FIG. 11c is a partial cross-sectional side view illustrating an embodiment of the tab engaged in the fastener opening.
Figure 11B:
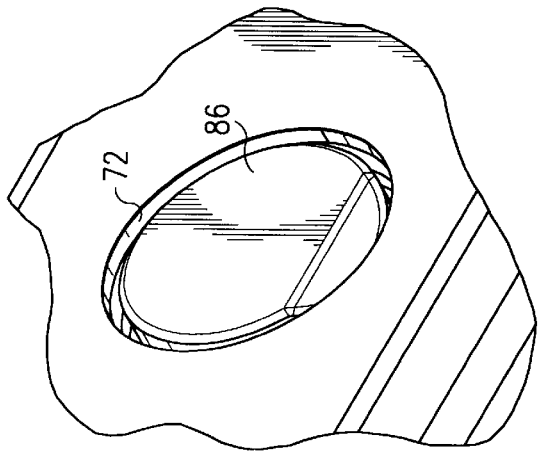
FIG. 11b is a partial isometric view illustrating an embodiment of the tab engaged in the fastener access opening.
Figure 11A:
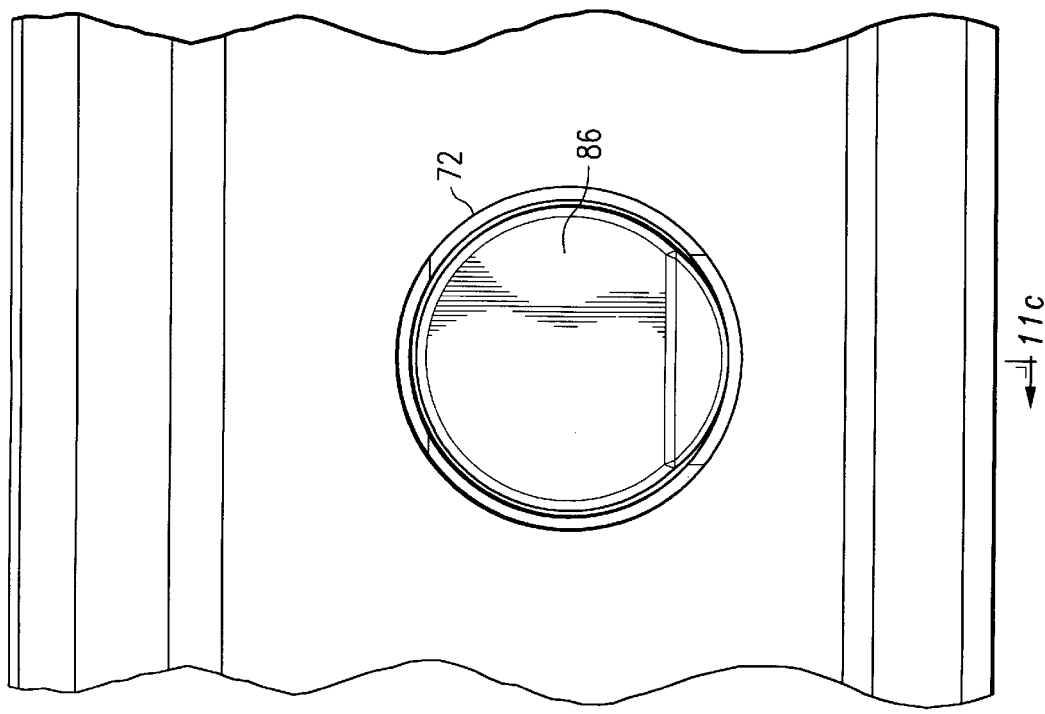
FIG. 11a is a partial view illustrating an embodiment of the tab engaged in a fastener access opening.

Tabs 86 FIGS. 9a,9b are guided into engagement with fastener access openings 72, FIG. 10, by a guide means such as guide grooves 90 formed on an inner surface 74a of sidewalls 74. Tabs 86, FIGS. 11, 11a, 11b, 11c, and fastener access openings 72 are of a similar shape, i.e. circular, but may be of any suitable shape. As a result, tabs 86 snap into engagement with fastener access openings 72 and completely cover or fill in the openings 72, in an aesthetically pleasing manner, therefore obviating the need for any additional parts to fill-in or cover fastener access openings 72. Removal of bezel 84 is facilitated by a tapered edge 92 on each tab 86 which engages an adjacent edge surface 94, FIG. 11c, of fastener opening 72 and flexes the associated arm 80 to move tabs 86 out of fastener access openings 72.

As it can be seen, the principal advantages of these embodiments are that a portable computer top includes a molded latch with a reinforcing metal insert which adds strength to the hook portion of the latch and also provides a resilient biasing force for the latch. In addition, the aesthetic issues associated with the metal latches are avoided because the metal part is molded into and covered by the plastic. In addition, a bezel is provided which covers the fastener access openings and also provides a snap-fit to retain the bezel on the portable computer top. This avoids the need for added parts such as covers for the fastener openings. Less parts results in less cost and less possibility for defective parts.

As a result, one embodiment provides an attachment system including a housing including opposed sidewalls having fastener access openings formed therein for mounting a component in the housing. A cover member is provided including tabs for attaching the cover member to the housing and for simultaneously closing the access openings.

Another embodiment provides a portable computer top for housing an LCD panel. The top includes opposite sides having fastener access openings formed therein for securing the LCD panel in the top. A bezel includes snap tabs for attaching the bezel to the top and for extending into the access openings.

Another embodiment provides a portable computer including a base and a top pivotally mounted on the base. An LCD panel is mounted in the top. The top includes opposed sides having fastener access openings for securing the LCD panel. A bezel includes snap tabs for attaching the bezel to the top and for covering the access openings.

Another embodiment provides a computer system including a chassis, a microprocessor mounted in the chassis, an input coupled to provide input in the microprocessor, a mass storage coupled to the microprocessor, a display coupled to the microprocessor by a video controller, and a memory coupled to provide storage to facilitate execution of computer programs by the microprocessor. A base portion of the chassis includes a top portion pivotally mounted thereon. An LCD panel is mounted in the top portion. The top portion includes opposed sides having fastener access openings for securing the LCD panel. A bezel includes snap tabs for attaching the bezel to the top by simultaneously engaging and covering the access openings.

Another embodiment provides a portable computer including a base and a top pivotally mounted on the base for movement between an open position and a closed position. An LCD panel is mounted in the top and the top includes opposed sides having fastener access openings for securing the LCD panel. A bezel including snap tabs is provided for attaching the bezel to the top and for covering the access openings. A releasable latch is mounted in the top adjacent the LCD panel for securing the top to the base in the closed position, and for releasing the top from the base for movement to the open position. A spring member is molded into the latch for resiliently mounting the latch in the top and for reinforcing a hook portion of the latch.

A further embodiment provides a method for securing an LCD panel in a portable computer top including the steps of mounting a bracket in the top, mounting an LCD panel in the top by inserting fasteners into openings in the bracket and into the LCD panel, accessing the fasteners through access openings formed in opposed sides of the top, and attaching a bezel to the top and simultaneously closing access openings by engaging snap tabs extending from the bezel with the opposed sides of the top and seating the tabs in the access openings.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A portable computer comprising:

a base;

a top pivotally mounted on the base;

an LCD panel mounted in the top, the top including opposed sides and an external surface, the sides having fastener access openings for securing the LCD panel; and a bezel including snap tabs for attaching the bezel to the top, and for covering the access openings by seating in the openings, the tabs each having a surface which is exposed through the access openings and seats flush with the external surface of the sides when seated.

2. The portable computer as defined in claim 1 wherein the tabs include means for facilitating removal of the tabs from the openings.

3. The portable computer as defined in claim 1 wherein the tabs are flexibly attached to extend from the bezel.

4. The portable computer as defined in claim 1 wherein the openings and the tabs are similarly shaped so that the tabs snap into the openings.

5. The portable computer as defined in claim 1 wherein the housing includes means for guiding the tabs into engagement with the openings.

6. A computer system comprising:

a chassis;

a microprocessor mounted in the chassis;

an input coupled to provide input to the microprocessor;

a mass storage coupled to the microprocessor;

a video controller coupled to the microprocessor;

a memory coupled to provide storage to facilitate execution of computer programs by the microprocessor;

a base portion of the chassis having a top portion pivotally mounted thereon for movement between an open position and a closed position;

an LCD panel mounted in the top portion, the top portion including opposed sides having fastener access openings for securing the LCD panel;

a bezel including snap tabs for attaching the bezel to the top by simultaneously engaging and covering the access openings;

a releasable latch mounted in the top adjacent the LCD panel for securing the top to the base in the closed position, and for releasing the top from the base for movement to the open position; and a spring member molded into the latch for resiliently mounting the latch in the top, and for reinforcing a hook portion of the latch.

7. The attachment system as defined in claim 6 wherein the tabs include a tapered edge for facilitating removal of the tabs from the openings.

8. The attachment system as defined in claim 6 wherein the tabs are flexibility attached to extend from the bezel.

9. The attachment system as defined in claim 6 wherein the openings and the tabs are similarly shaped so that the tabs snap into the openings.

10. The attachment system as defined in claim 6 wherein the housing includes guide grooves formed therewith for guiding the tabs into engagement with the openings.

11. A portable computer comprising:

a base;

a top pivotally mounted on the base for movement between an open position and a closed position;

an LCD panel mounted in the top, the top including opposed sides having fastener access openings for securing the LCD panel;

a bezel including snap tabs for attaching the bezel to the top, and for covering the access openings;

a releasable latch mounted in the top adjacent the LCD panel for securing the top to the base in the closed position, and for releasing the top from the base for movement to the open position; and a spring member molded into the latch for resiliently mounting the latch in the top, and for reinforcing a hook portion of the latch.

12. The portable computer as defined in claim 11 wherein the spring member extends through the latch including the hook portion and terminates at a free end of the spring member which protrudes from the latch.

13. The portable computer as defined in claim 12 wherein the free end of the spring member engages a portion of the top.

14. A method of securing an LCD panel in a portable computer comprising:

pivotally mounting a top on a base for movement between an open position and a closed position;

mounting a bracket in the top;

mounting an LCD panel in the top by inserting fasteners into openings in the bracket and into the LCD panel;

accessing the fasteners through access openings formed in opposed sides of the top;

attaching a bezel to the top and simultaneously closing the access openings by engaging snap tabs extending from the bezel with the opposed sides of the top and seating the snap tabs in the access openings;

mounting a releasable latch in the top adjacent the LCD panel for securing the top to the base in the closed position, and for releasing the top from the base for movement to the open position; and molding a spring member into the latch for resiliently mounting the latch in the top, and for reinforcing a hook portion of the latch.

15. The method as defined in claim 14 wherein attaching a bezel includes flexibly attaching the tabs to the bezel.

\* \* \* \* \*